(12) United States Patent
Shirasaki et al.

(10) Patent No.: US 10,629,505 B2
(45) Date of Patent: Apr. 21, 2020

(54) ELECTRONIC COMPONENT MOUNTING PACKAGE AND ELECTRONIC DEVICE USING THE SAME

(71) Applicant: KYOCERA Corporation, Kyoto-shi, Kyoto (JP)

(72) Inventors: Takayuki Shirasaki, Omihachiman (JP); Masahiko Taniguchi, Kirishima (JP); Takashi Miyauchi, Kirishima (JP)

(73) Assignee: Kyocera Corporation, Kyoto (JP)

( * ) Notice: Subject to any disclaimer, the term of this patent is extended or adjusted under 35 U.S.C. 154(b) by 15 days.

(21) Appl. No.: 15/574,437

(22) PCT Filed: Aug. 19, 2016

(86) PCT No.: PCT/JP2016/074237
§ 371 (c)(1),
(2) Date: Nov. 15, 2017

(87) PCT Pub. No.: WO2017/033860
PCT Pub. Date: Mar. 2, 2017

(65) Prior Publication Data
US 2018/0145003 A1 May 24, 2018

(30) Foreign Application Priority Data

Aug. 24, 2015 (JP) .................................. 2015-164884

(51) Int. Cl.
*H01L 23/04* (2006.01)
*H01L 23/02* (2006.01)
(Continued)

(52) U.S. Cl.
CPC .............. *H01L 23/04* (2013.01); *H01L 23/02* (2013.01); *H01L 23/055* (2013.01); *H01L 23/50* (2013.01);
(Continued)

(58) Field of Classification Search
CPC ......... H01L 23/02; H01L 23/04; H01L 23/22; H01L 23/045; H01L 23/047; H01L 23/50;
(Continued)

(56) References Cited

U.S. PATENT DOCUMENTS 4,292,464 A * 9/1981 Vogt ...................... H01L 23/049
174/152 GM
6,034,424 A * 3/2000 Fujimura ............. G02B 6/4204
257/433
(Continued)

FOREIGN PATENT DOCUMENTS

| CN | 101257073 A | 9/2008 |
|---|---|---|
| JP | 2005-333087 A | 12/2005 |
| JP | 2015-122466 A | 7/2015 |

OTHER PUBLICATIONS

International Search Report, PCT/JP2016/074237, dated Sep. 27, 2016, 1 pg.

*Primary Examiner* — Steven T Sawyer
*Assistant Examiner* — Paresh H Paghadal
(74) *Attorney, Agent, or Firm* — Volpe and Koenig, P.C.

(57) ABSTRACT

An electronic component mounting package includes a dielectric substrate between first portions of a pair of signal terminals that protrude from one side in a thickness direction from a first face of a base body. This dielectric substrate has a height lower than a height of the first portions. When an electronic component is mounted, a bonding wire is connected to a tip of each of the first portions to electrically connect the first portion to the electronic component.

13 Claims, 4 Drawing Sheets

(51) Int. Cl.
*H01S 5/022* (2006.01)
*H01L 23/055* (2006.01)
*H01L 23/50* (2006.01)
*H01L 33/48* (2010.01)
*H01L 33/64* (2010.01)
*H01L 23/08* (2006.01)
*H01L 23/12* (2006.01)
*H01L 23/10* (2006.01)
*H01L 23/045* (2006.01)
*H01L 23/049* (2006.01)
*H01L 23/047* (2006.01)
*H01L 33/62* (2010.01)

(52) U.S. Cl.
CPC .......... *H01L 33/483* (2013.01); *H01S 5/022* (2013.01); *H01S 5/02276* (2013.01); *H01L 23/045* (2013.01); *H01L 23/047* (2013.01); *H01L 23/049* (2013.01); *H01L 23/08* (2013.01); *H01L 23/10* (2013.01); *H01L 23/12* (2013.01); *H01L 33/62* (2013.01); *H01L 33/642* (2013.01); *H01L 2224/16227* (2013.01); *H01L 2224/48091* (2013.01); *H01L 2924/19107* (2013.01); *H01L 2924/3011* (2013.01); *H01S 5/02236* (2013.01)

(58) Field of Classification Search
CPC . H01L 23/055; H01L 23/057; H01L 23/0481; H01L 23/49827; H01L 33/483; H01L 33/62; H01L 2224/48091; H01L 2924/3011; H01S 5/022
See application file for complete search history.

(56) References Cited

U.S. PATENT DOCUMENTS

| | | | | |
|---|---|---|---|---|
| 6,707,073 | B1* | 3/2004 | Yamamoto | H01S 5/02212 257/100 |
| 7,037,001 | B2* | 5/2006 | Oomori | H01S 5/02212 372/31 |
| 7,263,112 | B2* | 8/2007 | Oomori | H01S 5/02212 257/99 |
| 7,856,038 | B2* | 12/2010 | Oomori | H01S 5/02236 372/34 |
| 8,519,280 | B2* | 8/2013 | Teske | A61N 1/3754 174/152 GM |
| 2003/0043868 | A1* | 3/2003 | Stewart | H01S 5/02212 372/36 |
| 2003/0218923 | A1* | 11/2003 | Giaretta | H01S 5/02212 365/200 |
| 2005/0121684 | A1* | 6/2005 | Aruga | G02B 6/4204 257/99 |
| 2006/0013282 | A1* | 1/2006 | Hanzawa | G01K 1/08 374/163 |
| 2006/0081866 | A1* | 4/2006 | Takahashi | B82Y 20/00 257/99 |
| 2008/0203510 | A1 | 8/2008 | Kawamura | |
| 2010/0074288 | A1* | 3/2010 | Yamamoto | H01S 5/02212 372/43.01 |
| 2013/0250520 | A1* | 9/2013 | Taniguchi | H01L 23/045 361/707 |

* cited by examiner

ELECTRONIC COMPONENT MOUNTING PACKAGE AND ELECTRONIC DEVICE USING THE SAME

TECHNICAL FIELD

The present invention is related to an electronic component mounting package that allows an electronic component, such as an optical semiconductor element used in an optical communication field or the like, to be mounted thereon and to an electronic device using the electronic component mounting package.

BACKGROUND ART

In recent years, demand for high-speed communication in a transmission distance of shorter than or equal to 40 km is abruptly increasing. Enhanced speed of electronic devices such as a semiconductor device that receives and emits optical signals using an optical communication device is receiving attention. An electronic device typified by such a semiconductor device has an optical output of approximately 0.2 to 0.5 mW, and a semiconductor element used as an electronic component has a driving electrical power of approximately 5 mW. However, a semiconductor device having a larger output has an optical output at a level of 1 mW, and a semiconductor element is also required to have a driving electrical power of greater than or equal to 10 mW. Furthermore, a conventional semiconductor device has a transmission speed of approximately 2.5 to 10 Gbps (Giga bit per second), but a semiconductor element that copes with 25 to 40 Gbps has been developed recently. A larger output and enhanced speed have been required for semiconductor devices.

In a semiconductor device that copes with a larger output and enhanced speed, a TO-CAN type package as described in Patent Document 1, for example, is used. The TO-CAN type package connects first portions of signal terminals that are inserted in a through hole of a plate-shaped base body and exposed from a first face of the base body to a semiconductor element mounted on a board mounting portion provided on the first face of the base body. In the TO-CAN type package, the signal terminals have a coaxial line structure and can cope with a larger output and enhanced speed. For the TO-CAN type, the first portions of the signal terminals exposed from the base body do not have the coaxial structure and are not surrounded by an insulating member and a conductive member. Thus, an unnecessary inductance component occurs, and a mismatch of characteristic impedance causes deterioration of electrical characteristics.

In the package disclosed in JP 2015-122466 A, the exposed first portions are covered with the insulating member and a dielectric body is provided between the pair of first portions to prevent deterioration of electrical characteristics. Although the exposed first portions are covered with the insulating member and the dielectric body is provided between the pair of first portions, characteristic impedance abruptly changes at a bonding wire on a tip of each of the first portions. Thus, deterioration of electrical characteristics cannot be sufficiently suppressed in some cases.

SUMMARY OF INVENTION

An electronic component mounting package according to one aspect of the present invention includes a base body, a pair of signal terminals, and a dielectric substrate. The base body is formed into a plate shape and has a through hole penetrating the base body in a thickness direction. The pair of signal terminals transmit a signal, are made from a linear metal conductor, and are provided in the through hole such that first portions protrude from one side in the thickness direction of a first face of the base body with a gap between the first portions. The dielectric substrate is provided between the first portions of the pair of signal terminals. The dielectric substrate is provided such that a second face and a third face are perpendicular to the first face of the base body, a side face abuts the first face of the base body, the second face faces one of the first portions, and the third face faces the other first portion. The dielectric substrate has a height lower than that of the first portions with reference to the first face of the base body.

An electronic device according to one aspect of the present invention includes the above-described electronic component mounting package, and an electronic component mounted on one front face of the base body.

DESCRIPTION OF EMBODIMENTS

Figure 1:
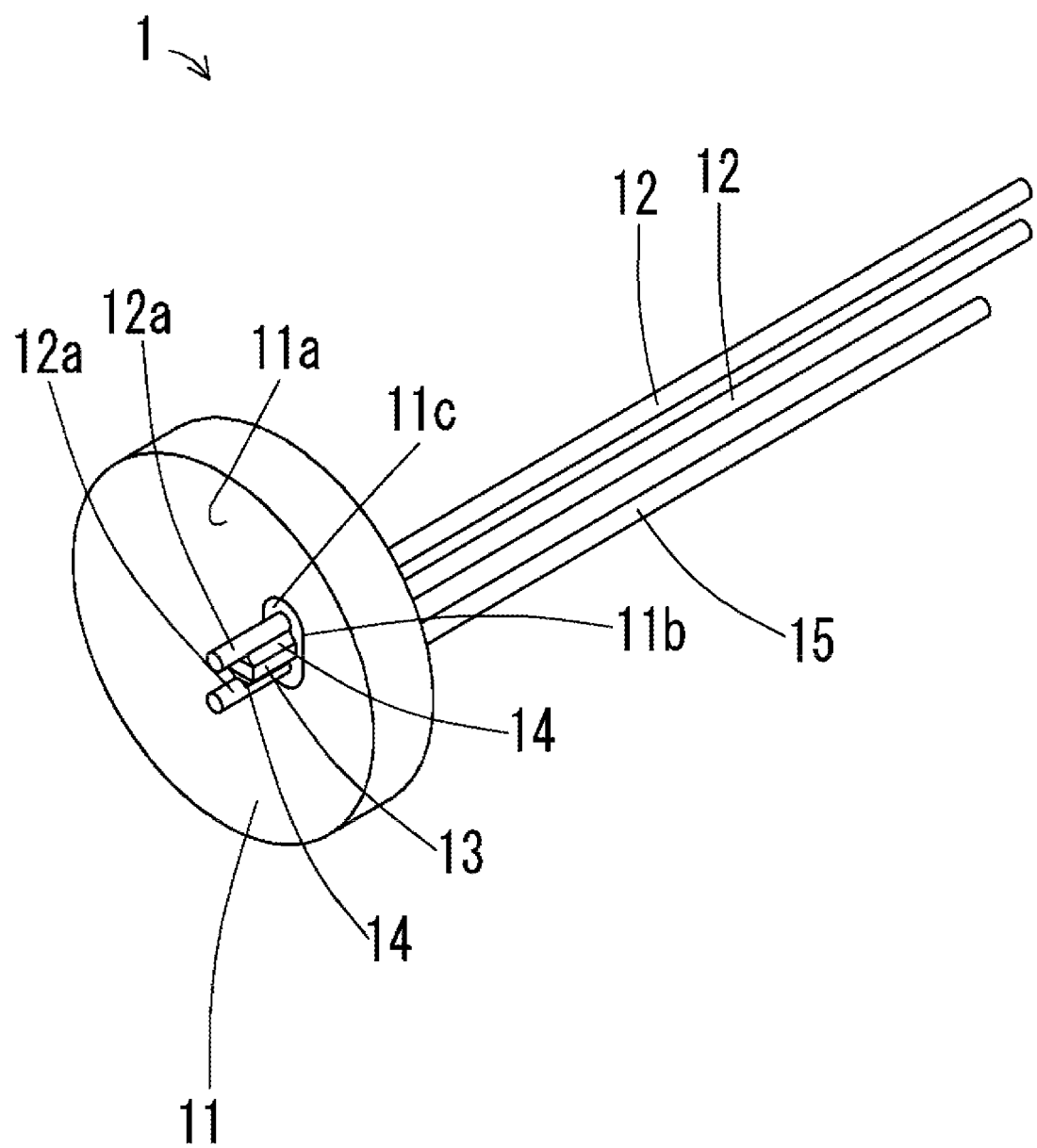
FIG. 1 is a perspective view of an electronic component mounting package 1 according to one embodiment of the present invention when seen from a first face 11a side of a base body 11.
Figure 2:
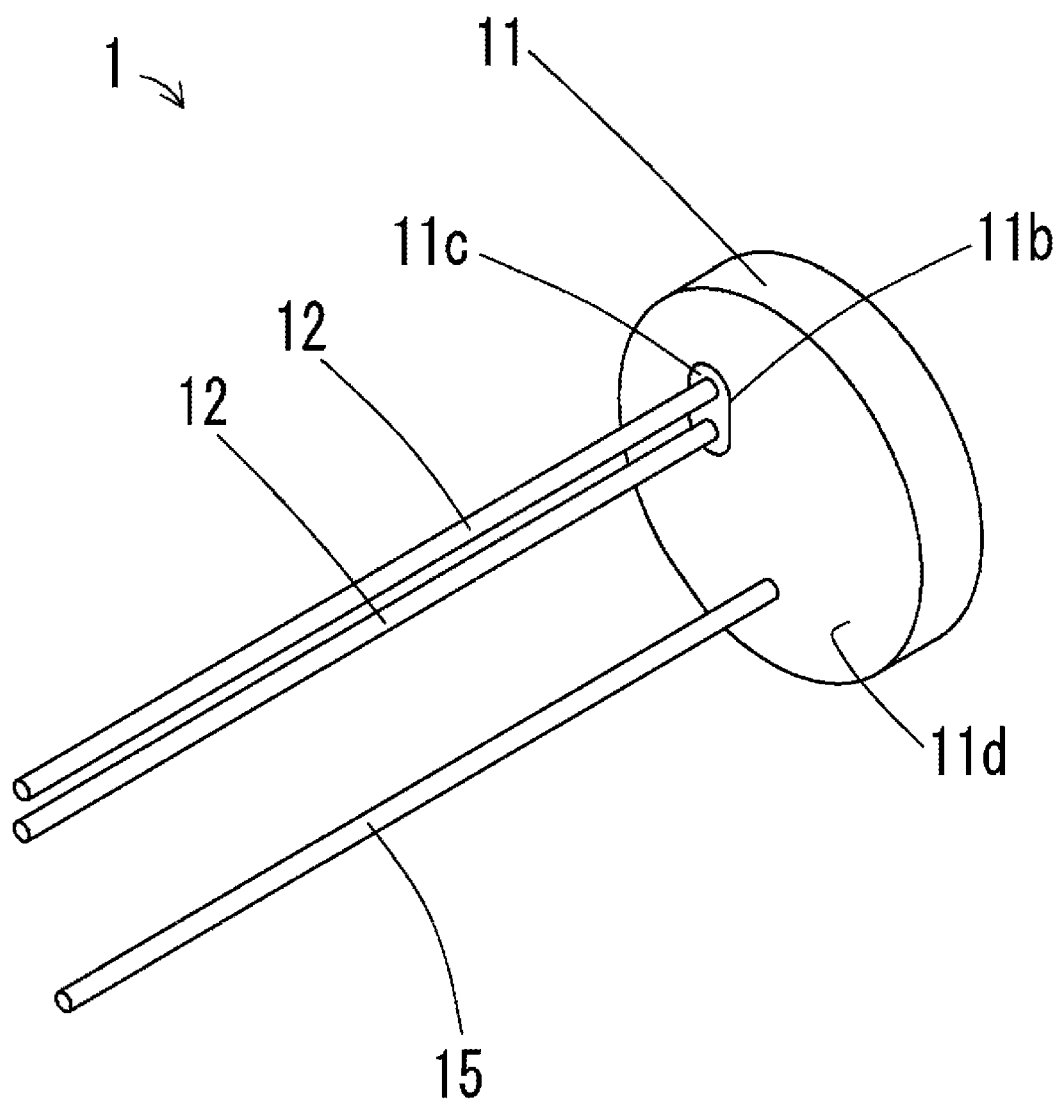
FIG. 2 is a perspective view of the electronic component mounting package 1 when seen from a fourth face 11d side of the base body 11.
Figure 3A:
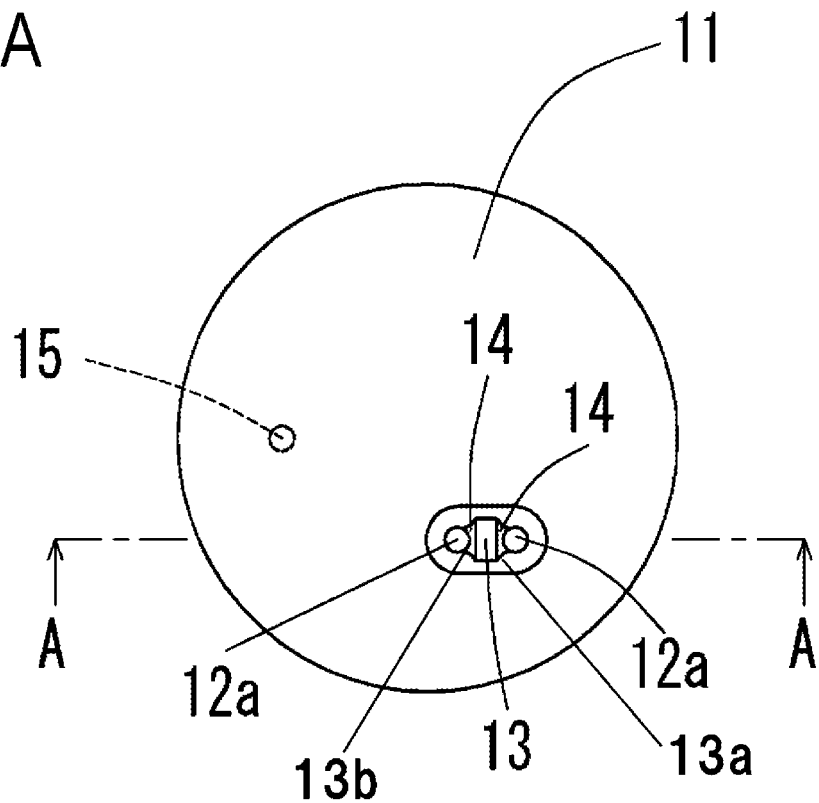
FIG. 3A is a plan view of the electronic component mounting package 1.
Figure 3B:
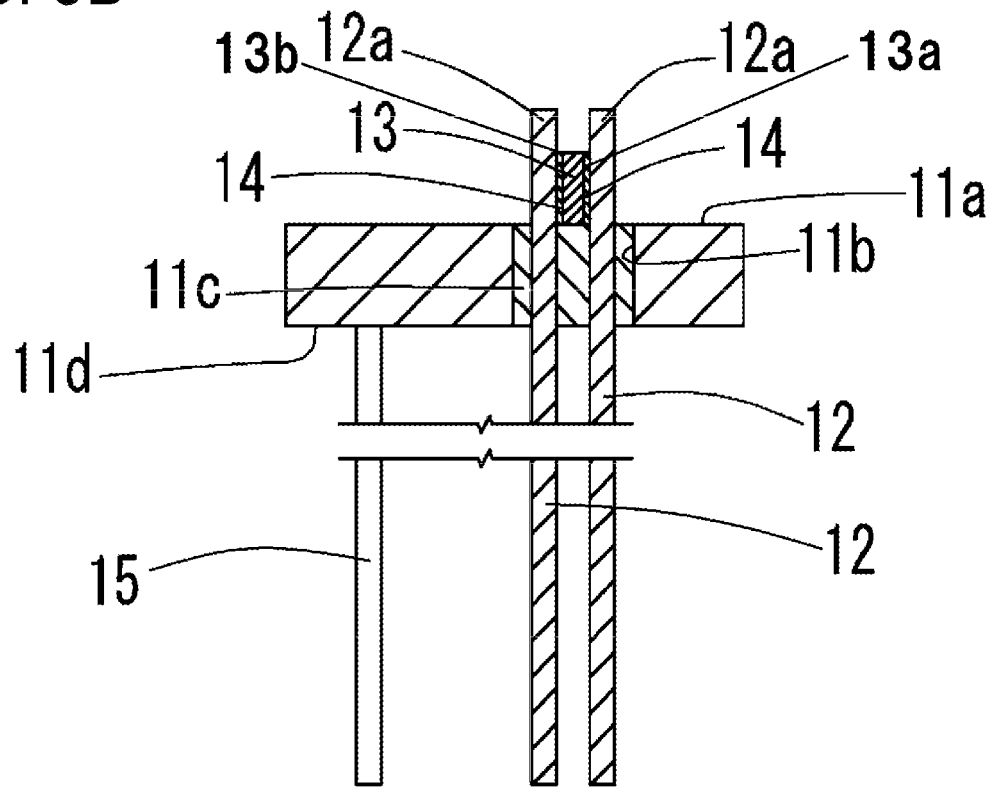
FIG. 3B is a cross-sectional view of the electronic component mounting package 1.
Figure 4:
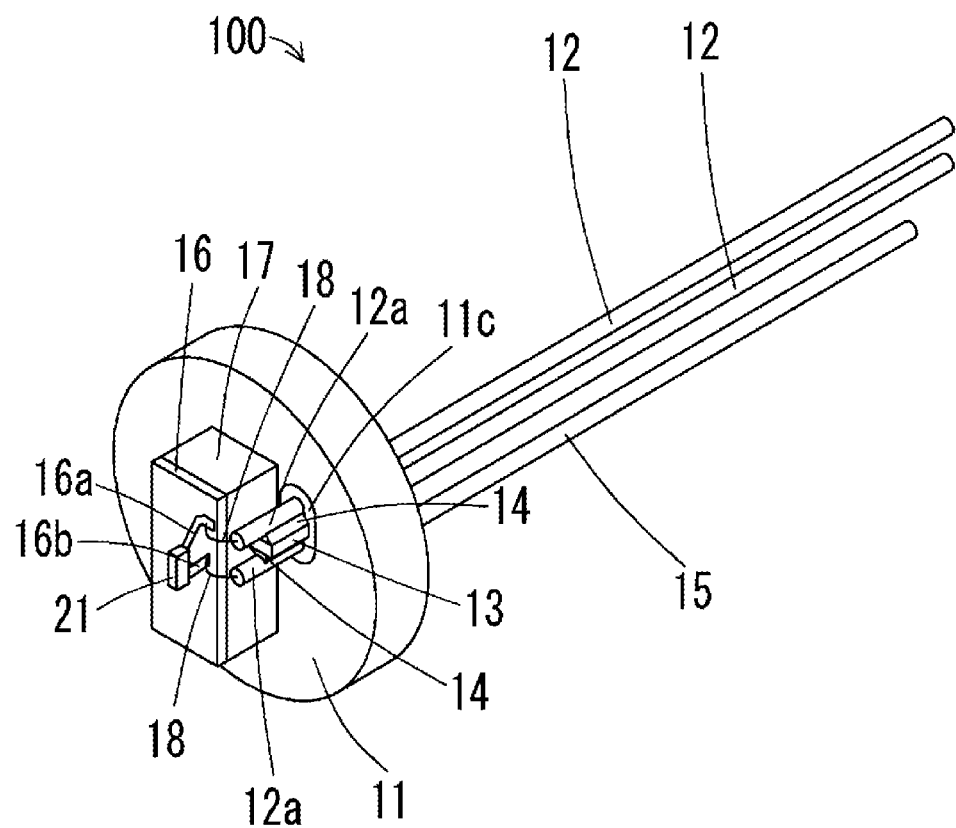
FIG. 4 is a perspective view of an electronic device 100 when seen from the first face 11a side of the base body 11.

An electronic component mounting package and an electronic device according to an embodiment of the present invention will be described in detail with the accompanying drawings. FIG. 1 is a perspective view of an electronic component mounting package 1 according to one embodiment of the present invention when seen from a first face 11a side of a base body 11. FIG. 2 is a perspective view of the electronic component mounting package 1 when seen from a fourth face 11d side of the base body 11. FIGS. 3A and 3B are plan view and a cross-sectional view of the electronic component mounting package 1. FIG. 3A is the plan view, and FIG. 3B is the cross-sectional view taken along a sectional line A-A in FIG. 3A. FIG. 4 is a perspective view illustrating a configuration of an electronic device 100 according to the present embodiment.

The electronic component mounting package 1 is a package that allows an electronic component 21, such as an optical semiconductor element, to be mounted thereon. The electronic device 100 is a semiconductor device that receives and emits optical signals using an optical communication device. The electronic device 100 includes the electronic component mounting package 1 and the electronic component 21 mounted on the first face 11a of the base body 11 of the electronic component mounting package 1.

The electronic component mounting package 1 includes the base body 11, a pair of signal terminals 12 that penetrate the base body 11 and are made from a linear metal conductor for transmitting a high-frequency signal, a dielectric substrate 13 provided between first portions 12a of the pair of signal terminals 12, a bonding material 14 that bonds the dielectric substrate 13 and the first portions 12a together, and a ground terminal 15. Note that the high-frequency signal represents a signal compatible with greater than or equal to 2.5 Gbps of a transmission speed of a semiconductor device.

The base body 11 has a through hole 11b penetrating the base body 11 in a thickness direction, and has a function of radiating heat generated by the mounted electronic component 21 to the outside of the electronic component mounting package 1. The base body 11 is made of metal having excellent thermal conductivity. For example, an iron-based alloy such as a Fe—Ni—Co alloy and a Fe—Mn alloy or a metal such as pure iron that has a thermal expansion coefficient close to that of the electronic component 21 mounted on the electronic device 100, a wiring board 16 made of ceramic, or a submount 17 is selected as the metal for the base body 11. More specifically, the metal includes a Fe 99.6 mass %-Mn 0.4 mass %-based SPC (steel plate cold) material. For example, when the base body 11 is made of the Fe—Mn alloy, the base body 11 is manufactured into a predetermined shape by performing a well-known metal processing method such as rolling and punching on its ingot (solid piece). The through hole 11b is formed by drilling, for example.

The shape of the base body 11 is a flat plate shape usually having a thickness of 0.5 to 2 mm. This shape is not particularly restrictive. For example, it may be a circular disk shape having a diameter of 3 to 10 mm, a semi-circular disk shape having a radius of 1.5 to 8 mm and having a partially cut circumference, a quadrilateral shape having one side of 3 to 15 mm, or the like. The thickness of the base body 11 may not necessarily be uniform. For example, a thick thickness on the outside of the base body 11 allows a heat radiating body such as a case that houses the electronic device 100 to be easily adhering to the base body 11. Thus, heat generated by the electronic component 21 is more easily radiated to the outside through the base body 11.

The base body 11 preferably has a thickness of 0.5 mm to 2 mm. If the base body 11 has a thickness of less than 0.5 mm, the base body 11 may be easily bent or deformed depending on bonding conditions such as bonding temperature when a metal lid for protecting the electronic component 21 is bonded to the first face 11a of the base body 11 made of metal. Accordingly, airtightness easily decreases due to the deformation. On the other hand, if the base body 11 has a thickness exceeding 2 mm, the electronic component mounting package 1 and the electronic device 100 have an increased thickness and are thus hardly reduced in size.

It is preferable that a Ni layer having a thickness of 0.5 to 9 μm and a Au layer having a thickness of 0.5 to 5 μm are successively adhering to the first face 11a of the base body 11 by a plating method. The Ni layer and the Au layer have excellent corrosion resistance and excellent wettability with a bonding material (brazing material) for bonding and fixing the electronic component 21, the wiring board 16, or the lid. Thus, oxidation corrosion of the base body 11 can be effectively prevented, and the lid or the like can be sufficiently brazed (bonded) to the base body 11.

The submount 17 is provided on the first face 11a of the base body 11 and has a board mounting face parallel to the first face 11a. In the electronic component mounting package 1, the submount 17 transmits heat generated by the electronic component 21 mounted on the wiring board 16 mounted on the board mounting face to the base body 11. For example, the submount 17 has a function of radiating heat from a front face of the base body 11 to the outside of the electronic component mounting package 1.

In the present embodiment, the submount 17 may be integrally formed with the base body 11, and may include a cooling member (such as a Peltier element) that cools the wiring board 16. If being integrally formed with the base body 11, the submount 17 is made of the same metal having excellent thermal conductivity as that for the base body 11 and is formed into a pillar shape having a board mounting face parallel to the first face 11a of the base body 11.

The wiring board 16 is provided on the board mounting face of the submount 17, and the electronic component 21 is installed on the wiring board 16. The wiring board 16 is provided with a signal line conductor 16a and a signal line conductor 16b. The signal line conductor 16a transmits a high-frequency signal from one signal terminal 12 of the pair of signal terminals 12 to the electronic component 21. The signal line conductor 16b transmits a high-frequency signal from the other signal terminal 12 of the pair of signal terminals 12 to the electronic component 21. The high-frequency signal transmitted through the pair of signal terminals 12 is a differential signal.

The wiring board 16 is a wiring conductor that includes the signal line conductors 16a, 16b and is formed on an insulating substrate made from a ceramic insulating material such as aluminum oxide (alumina: $Al_2O_3$)-based sintered compact and aluminum nitride (AlN)-based sintered compact. When the insulating substrate is made from, for example, the aluminum oxide-based sintered body, appropriate organic solvent and solvent are first added to raw material powder such as alumina ($Al_2O_3$), silica ($SiO_2$), calcia (CaO), and magnesia (MgO) and mixed into a slurry. This is then formed into a sheet shape by a doctor blade method or a calender roll method to obtain a ceramic green sheet (hereinafter also referred to as a green sheet). Subsequently, the green sheet is punched into a predetermined shape, and a plurality of green sheets are laminated as necessary and then fired at a temperature of approximately 1600° C. to be manufactured.

For the wiring board 16, examples of a method for forming the wiring conductor including the signal line conductors 16a, 16b include a method for forming a metallization layer by simultaneously firing the wiring conductor and the insulating substrate or after the insulating substrate is manufactured and a method for forming the wiring conductor by vaporizing or photolithography after the insulating substrate is manufactured. When the electronic device 100 is small, the wiring board 16 mounted on the electronic device 100 is even smaller and the wiring conductor is thus fine. The method for forming the wiring conductor by vaporizing or photolithography is preferable to enhance precision of alignment between the wiring conductor and the pair of signal terminals 12. In this case, a polishing process may be performed on a main surface of the insulating substrate as necessary.

The signal line conductors 16a, 16b and the pair of signal terminals 12 are electrically connected to each other with bonding wires 18 provided between tips of the first portions 12a of the signal terminals 12 and end portions of the signal line conductors 16a, 16b. The signal line conductors 16a, 16b and the electronic component 21 may be wire-connected to each other with bonding wires. A terminal provided on the electronic component 21 and the signal line conductors 16a, 16b may be directly bonded to each other with solder or the like, that is to say, they may be bump-connected to each other.

The bonding wires 18 are wire members provided between the tips of the first portions 12a of the signal terminals 12 and the end portions of the signal line conductors 16a, 16b by a known wire bonding method. For example, a gold wire, an aluminum wire, or the like can be used as the bonding wire 18.

Hereinafter, a case where the wiring conductor is formed on the wiring board 16 by vaporizing or photolithography will be described in detail. The wiring conductor is formed of a conductor layer having a three-layered structure in which a contact metal layer, a diffusion preventing layer, and a main conductor layer are successively laminated, for example.

From the perspective of excellent adhesiveness with the insulating substrate made of ceramic or the like, the contact metal layer is preferably made of at least one kind of metals that have a thermal expansion coefficient close to ceramic, such as titanium (Ti), chromium (Cr), tantalum (Ta), niobium (Nb), a nickel-chromium (Ni—Cr) alloy, and tantalum nitride ($Ta_2N$). The contact metal layer preferably has a thickness of 0.01 to 0.2 µm. If the contact metal layer has a thickness of less than 0.01 µm, it tends to be difficult to firmly adhere the contact metal layer to the insulating substrate. If the contact metal layer has a thickness exceeding 0.2 µm, the contact metal layer tends to easily peel off the insulating substrate due to internal stress during film formation.

From the perspective of preventing mutual diffusion between the contact metal layer and the main conductor layer, the diffusion preventing layer is preferably made of at least one kind of metals that have excellent thermal conductivity, such as platinum (Pt), palladium (Pd), rhodium (Rh), nickel (Ni), a Ni—Cr alloy, and a Ti—W alloy. The diffusion preventing layer preferably has a thickness of 0.05 to 1 µm. If the diffusion preventing layer has a thickness of less than 0.05 µm, it tends to be difficult to function as the diffusion preventing layer because a defect such as a pin hole occurs. If the diffusion preventing layer has a thickness exceeding 1 µm, the diffusion preventing layer tends to easily peel off the contact metal layer due to internal stress during film formation. Note that, if the Ni—Cr alloy is used as the diffusion preventing layer, the contact metal layer can be omitted because the Ni—Cr alloy has excellent adhesiveness with the insulating substrate.

The main conductor layer is preferably made of at least one kind of metals that have a small electric resistance, such as gold (Au), copper (Cu), nickel (Ni), and silver (Ag). The main conductor layer preferably has a thickness of 0.1 to 5 µm. If the main conductor layer has a thickness of less than 0.1 µm, an electric resistance increases and it tends to be difficult to satisfy an electric resistance needed for the wiring conductor of the wiring board 16. If the main conductor layer has a thickness exceeding 5 µm, the main conductor layer tends to easily peel off the diffusion preventing layer due to internal stress during film formation. Furthermore, Cu is easily oxidized, so that Cu may be covered with a protective layer made of Ni and Au.

The pair of signal terminals 12 are formed into a rod shape having a circular cross-section. The first portions 12a are each exposed from the first face 11a of the base body 11 and are inserted into the through hole 11b with a gap between the first portions 12a. The through hole 11b except for the portions of the signal terminals 12 is filled with an insulating material 11c. The first portions 12a each have a length of 1 to 5 mm, for example. The pair of signal terminals 12 are provided in the through hole 11b such that the first portions 12a each protrude from one side in a thickness direction of the first face 11a of the base body 11 with a gap between the first portions 12a.

The insulating material 11c is made from an insulating inorganic dielectric material such as glass and ceramic. The insulating material 11c has a function of fixing the signal terminals 12 in the through hole 11b of the base body 11 while securing an insulating gap between the signal terminals 12 and the base body 11. Examples of this insulating material 11c include glass, such as borosilicate glass and soda glass, and these glasses to which a ceramic filler for adjusting a thermal expansion coefficient and a relative dielectric constant is added. Then, its relative dielectric constant is appropriately selected for impedance matching. Examples of a filler for reducing a relative dielectric constant include lithium oxide.

To fix the signal terminals 12 that penetrate the insulating material 11c filling the through hole 11b, when the insulating material 11c is made of glass, for example, glass powder is first molded by powder pressing or extrusion molding. A tubular powder compact is then manufactured such that its inner diameter matches an outer diameter of the signal terminals 12 and its outer diameter matches the shape of the through hole 11b. The signal terminals 12 are inserted in a hole of this powder compact, and the powder compact is inserted in a mold. After glass is heated at a predetermined temperature and melted, the glass is cooled and solidified, to thereby form the insulating material 11c having a predetermined shape to which the signal terminals 12 are fixed. Accordingly, the through hole 11b is hermetically sealed with the insulating material 11c, and the signal terminals 12 and the base body 11 are insulated from and fixed to each other by the insulating material 11c, to thereby form a coaxial line structure. By forming only the insulating material 11c that matches the shape of the through hole 11b in advance and inserting this into the through hole 11b and also the signal terminals 12 into the hole of the insulating material 11c, the insulating material 11c and an inner face of the through hole 11b may be bonded to each other simultaneously with bonding of an outer face of the signal terminals 12 and an inner face of the hole of the insulating material 11c to each other.

The dielectric substrate 13 is formed into a plate shape and provided between the first portions 12a. The dielectric substrate 13 is provided such that a second face 13a and a third face 13b are perpendicular to the first face 11a of the base body 11, a side face abuts the first face 11a of the base body 11, the second face 13a faces one of the first portions 12a, and the third face 13b faces the other first portion 12a. In other words, the dielectric substrate 13 is provided such that the two first portions 12a sandwich the dielectric substrate 13 in a thickness direction (direction parallel to a virtual line connecting the signal terminals 12) on the first face 11a of the base body 11. Moreover, the dielectric substrate 13 has a height lower than that of the first portions 12a in a direction orthogonal to the first face 11a with reference to the first face 11a of the base body 11.

In the present embodiment, the high-frequency signal transmitted through the pair of signal terminals 12 is a differential signal. A differential signal is transmitted through two transmission lines that are electromagnetically coupled to each other, namely, pair wiring. In the electronic component mounting package 1 of the present embodiment, the pair of signal terminals 12 as pair wiring transmit a differential signal. In the coaxial line structure in which the pair of signal terminals 12 are fixed in the through hole 11b through the insulating material 11c, sufficient electromagnetic coupling can be obtained because the insulating material 11c made from a dielectric material is located between the pair of signal terminals 12. However, electromagnetic coupling is weak between the two first portions 12a without the dielectric material. Accordingly, electromagnetic coupling between the two first portions 12a can be strengthened by providing the dielectric substrate 13 between the two first portions 12a. Thus, the electronic component mounting package 1 of the present embodiment has excellent transmission characteristics of differential signals, and can also suppress cross talk occurring between the two first portions 12a when a differential signal is transmitted through the signal terminals 12. Furthermore, in the electronic component mounting package 1 of the present embodiment, when the two first portions 12a are bonded and fixed with the bonding material 14 so as to sandwich the dielectric substrate 13 therebetween, rigidity of the first portions 12a improves and the first portions 12a are less likely to be deformed. Thus, deformation of the first portions 12a during wire bonding of the tips of the first portions 12a can be suppressed. The deformation of the first portions 12a due to heat applied to the first portions 12a in steps of manufacturing the electronic component mounting package 1 and the electronic device 100 or when actuating the electronic device 100 can also be suppressed. As a result, fluctuations in characteristic impedance due to the deformation of the first portions 12a can be suppressed.

In the signal terminals 12, a portion of the base body 11 in the through hole 11b, namely, a portion of the base body 11 surrounded by the insulating material 11c surrounded by the through hole 11b of the base body 11 has a coaxial structure where stable transmission characteristics can be obtained with less fluctuation in characteristic impedance. However, the first portions 12a exposed from the first face 11a are not surrounded by the insulating material 11c and the base body 11, so that a capacity component decreases, an inductance component increases, and transmission characteristics of high-frequency signals are inferior to the coaxial structured portion. A characteristic impedance of the first portions 12a exposed from the first face 11a is greater than that of the coaxial structured portion in the through hole 11b. The transmission characteristics of the first portions 12a themselves having a high characteristic impedance deteriorate, and a characteristic impedance at a boundary portion between the coaxial structured portion in the through hole 11b and the first portions 12a abruptly and greatly changes. This increases a return loss, an insertion loss, or the like of high-frequency signals, and the transmission characteristics greatly deteriorate. Both a decrease in capacity component and an increase in impedance component can be suppressed and a change in characteristic impedance from the coaxial structured portion in the through hole 11b to the first portions 12a can be reduced by providing the dielectric substrate 13 between the two first portions 12a.

As described above, the tips of the first portions 12a of the signal terminals 12 and the signal line conductors 16a, 16b are connected to each other with the bonding wires 18. A portion of the bonding wire 18 through which high-frequency signals are transmitted has a diameter smaller than that of the first portion 12a and is not surrounded by the insulating material. Thus, a capacity component decreases and an inductance component increases more than those of the first portions 12a, and transmission characteristics of high-frequency signals are inferior to the coaxial structured portion while a characteristic impedance increases more than that of the coaxial structured portion. In other words, a characteristic impedance is high in descending order of the coaxial structured portion in the through hole 11b, the first portions 12a, and the bonding wires 18, and abruptly changes at each boundary portion.

A magnitude of characteristic impedance of the first portions 12a is brought closer to that of the coaxial structured portion in the through hole 11b by providing the dielectric substrate 13. This can reduce a difference in magnitude of characteristic impedance between the coaxial structured portion in the through hole 11b and the first portions 12a. On the other hand, a difference in magnitude of characteristic impedance increases, that is to say, a change increases at boundary portions of connecting portions between the first portions 12a and the bonding wires 18. In this technology, the dielectric substrate 13 is provided between the two first portions 12a. If, however, the dielectric substrate has the same height as that of the first portions 12a, a change in characteristic impedance increases at the boundary portions of the connecting portions between the first portions 12a and the bonding wires 18, and a return loss or an insertion loss occurring when high-frequency signals are transmitted between the first portions 12a and the bonding wires 18 increases.

As in the present embodiment, the dielectric substrate 13 has a height lower than that of the first portions 12a, so that there are the portions of the first portions 12a adjacent to the dielectric substrate 13 and the portions thereof, which are not adjacent to the dielectric substrate 13, between the connecting portions of the first portions 12a and the bonding wires 18. The portion of the first portion 12a, which is not adjacent to the dielectric substrate 13, has a capacity component lower than that of the portion thereof adjacent to the dielectric substrate 13 and greater than that of the portion of the bonding wire 18 having a diameter smaller than that of the first portion 12a. Thus, the portion of the first portion 12a, which is not adjacent to the dielectric substrate 13, has a characteristic impedance greater than that of the portion thereof adjacent to the dielectric substrate 13 and lower than that of the portion of the bonding wire 18. The portion of the first portion 12a, which is not adjacent to the dielectric substrate 13, and the portion thereof adjacent to the dielectric substrate 13 vary in characteristic impedance. The portion of the first portion 12a, which is not adjacent to the dielectric substrate 13, and the bonding wire 18 also vary in characteristic impedance. Both of the differences are smaller than a difference in characteristic impedance between the portion of the first portion 12a, which is adjacent to the dielectric substrate 13, and the bonding wire 18.

Therefore, as in the present embodiment, the portions of the first portions 12a adjacent to the dielectric substrate 13 and the portions, which are not adjacent to the dielectric substrate 13, between the first portions 12a and the bonding wires 18 are provided. This can make a slow change in characteristic impedance from the first portions 12a, which are adjacent to the dielectric substrate 13, to the bonding wires 18 compared to the structure of the conventional technology. With a slow change in characteristic impedance, a return loss and an insertion loss occurring when high-frequency signals are transmitted can be reduced, and deterioration of transmission characteristics of high-frequency signals can be suppressed. A width of the dielectric substrate 13 in a direction perpendicular to the virtual line connecting the first portions 12a is preferably larger than a width of the first portion 12a. Accordingly, both a decrease in capacity component and an increase in impedance component between the two first portions 12a can be effectively suppressed. Also, a change in characteristic impedance from the coaxial structured portion formed of the portions of the signal terminals 12 surrounded by the through hole 11b through the insulating material 11c to the portions of the first portions 12a that sandwich the dielectric substrate 13 therebetween can be reduced.

The bonding wire 18 is a transmission line that makes it difficult to transmit high-frequency signals therethrough because the bonding wire 18 has such a structure that an inductance component is great and no ground conductor is located nearby in addition to having a great difference in characteristic impedance between the first portion 12a and the bonding wire 18. Therefore, the bonding wire 18 preferably has a length as short as possible. A distance between the tip of the first portion 12a and the wiring board 16 needs to be short in order to shorten the bonding wire 18. A difference between the height of the wiring board 16 (height of the submount 17) and the height of the tip of the first portion 12a needs to be small in order to shorten the distance between the tip of the first portion 12a and the wiring board 16. If the submount 17 includes a cooling member such as a Peltier element, the submount 17 has a relatively great height, and the tip of the first portion 12a also has a great height according to the height of the submount 17. If the first portion 12a has a great height, the portion of the first portion 12a that reduces transmission characteristics of high-frequency signals has a great length. Thus, the effect of providing the dielectric substrate 13 between the two first portions 12a can be further achieved.

If there is even a small portion, which is not adjacent to the dielectric substrate 13, that is to say, if there is even a slight difference in height between the first portion 12a and the dielectric substrate 13, the effect of suppressing deterioration of transmission characteristics of high-frequency signals can be achieved compared to the conventional structure without the difference. The portion, which is not adjacent to the dielectric substrate 13, has a 10 to 50% length of the length of the first portion 12a. A thickness of the dielectric substrate 13 (thickness in the direction parallel to the virtual line connecting the signal terminals 12), and a height from the first face 11a of the base body 11, which is a length from the first face 11a of the base body 11 to the tip of the first portion 12a, may be set according to a gap between the first portions 12a and a length of each of the first portions 12a. A width of the dielectric substrate 13 in the direction perpendicular to the virtual line connecting the first portions 12a is preferably smaller than a width of the through hole 11b (width of the insulating material 11c) in the direction perpendicular to the virtual line connecting the first portions 12a.

In other words, the dielectric substrate 13 may be provided on an inner side of the through hole 11b in a plan view of the electronic component mounting package 1 seen from the first face 11a side of the base body 11. Accordingly, stress due to each difference in thermal expansion coefficient occurring between the base body 11, the insulating material 11c, and the dielectric substrate 13 can be reduced. Also, occurrence of breakage or cracking in the insulating material 11c and the dielectric substrate 13 due to this stress can be suppressed. When a metal material is used as the bonding material 14 that bonds the dielectric substrate 13 and the first portions 12a to improve heat radiating properties of the electronic component mounting package 1, an electrical short between the base body 11 and the signal terminals 12 caused by the bonding material 14 can be also suppressed.

A resin material and a ceramic material having insulating properties can be used for the dielectric substrate 13 to prevent a short between the first portions 12a. A ceramic material that is less deformed by heat and has a high dielectric constant is preferably used. An aluminum oxide-based sintered body, an aluminum nitride-based sintered body, a mullite-based sintered body, a silicon carbide sintered body, a silicon nitride sintered body, and a glass ceramic can be used as the ceramic material. When the dielectric substrate 13 is made from, for example, the aluminum oxide-based sintered body, a green sheet formed into a sheet shape by a known doctor blade method or a well-known calender roll method is punched into a predetermined shape, similarly to the insulating substrate of the wiring board 16. A plurality of green sheets are laminated as necessary and then fired at a temperature of approximately 1600° C. to be manufactured.

The side face of the dielectric substrate 13 that contacts the first face 11a of the base body 11 may be fixed with an adhesive made from a resin material or a glass material. To prevent the dielectric substrate 13 from falling off, the bonding material 14 that bonds the second face 13a of the dielectric substrate 13 and one of the first portions 12a together and bonds the third face 13b and the other first portion 12a together may be included. As in the present embodiment, the dielectric substrate 13 has the height lower than that of the first portions 12a and the bonding material 14 bonds the second face 13a of the dielectric substrate 13 and one of the first portions 12a together and bonds the third face 13b and the other first portion 12a together. This can suppress stress generated between the tips of the first portions 12a, to which the dielectric substrate 13 is not bonded, and the dielectric substrate 13 while improving rigidity of the first portions 12a by the dielectric substrate 13.

As a result, deformation of the first portions 12a can be suppressed, fluctuations in characteristic impedance caused by the deformation of the first portions 12a can be suppressed, and the occurrence of cracking or breakage in the dielectric substrate 13 can be suppressed. Furthermore, the bonding wires 18 can be prevented from peeling off the first portions 12a. The tips of the first portions 12a to which the dielectric substrate 13 is not bonded are moderately deformed to relieve stress. This can suppress the occurrence of cracking or breakage in the dielectric substrate 13 caused by stress applied to the first portions 12a when the bonding wires 18 are connected to the first portions 12a.

As the bonding material 14, a brazing material of a gold-tin (Au—Sn) alloy or a gold-germanium (Au—Ge) alloy, a brazing material of a tin-silver (Sn—Ag) alloy or a tin-silver-copper (Sn—Ag—Cu) alloy having a melting point lower than that of the brazing material of the gold-tin alloy or the gold-germanium alloy, or an adhesive made of resin such as Ag epoxy resin can be used. To increase wettability of the bonding material 14 and make bonding stronger, a metal layer may be provided on both main surfaces (the second face 13a and the third face 13b) of the dielectric substrate 13 by plating or the like.

Although a shape of the tip of each of the first portions 12a of the pair of signal terminals 12 is not particularly limited, the tip may be tapered such that its shape is hemispherical, truncated conical, or truncated quadrangular pyramidal. The tip of each of the first portions 12a of the pair of signal terminals 12 is tapered, resulting in a slow change in shape of the transmission path for high-frequency signals. This leads to a slower change in characteristic impedance at the connecting portion between the tip of each of the first portions 12a and the bonding wire 18.

The pair of signal terminals 12 are made of a metal conductor of a Fe—Ni—Co alloy, a Fe—Ni alloy, or the like. For example, when the signal terminals 12 are made of the Fe—Ni—Co alloy, a well-known metal processing method such as rolling, punching, and cutting is performed on its ingot (solid piece). Then, the signal terminals 12 are linearly manufactured so as to each have a length of 1.5 to 22 mm and a diameter of 0.1 to 1 mm. To reduce the pair of signal terminals 12 in size while securing the strength thereof and matching higher characteristic impedance, the pair of signal terminals 12 each have a diameter of 0.15 to 0.25 mm. If the pair of signal terminals 12 each have a diameter of less than 0.15 mm, the signal terminals 12 are easily bent during handling when the electronic component mounting package 1 is installed, and workability is likely to decrease. If the pair of signal terminals 12 each have a diameter exceeding 0.25 mm, the through hole 11b in a case where impedance is matched has a larger diameter due to the diameter of the signal terminal 12. Thus, it is not suitable for size reduction of a product.

Second portions of the pair of signal terminals 12 are inserted in an insertion hole that is formed in the installing substrate, for example, and has a conductor layer on an inner peripheral surface. The conductor layer of the insertion hole and an external electrical circuit are electrically connected to each other, and the signal terminals 12 have a function of transmitting input signals and output signals between the electronic component 21 and the external electrical circuit.

In the present embodiment, the ground terminal 15 is bonded to the base body 11. The ground terminal 15 is connected to a ground potential and manufactured similarly to the signal terminals 12. The ground terminal 15 is bonded to the fourth face 11d of the base body 11 with a bonding material (brazing material). A hole is formed in the fourth face 11d of the base body 11 in advance to improve ease of alignment and bonding strength, and the ground terminal 15 may be inserted in the hole and bonded thereto. In this way, the ground terminal 15 is bonded to the base body 11. Thus, the ground terminal 15 is inserted in the insertion hole of the installing substrate similarly to the signal terminals 12, and is provided with a ground potential. Accordingly, the base body 11 to which the ground terminal 15 is bonded functions as a ground conductor.

Examples of the electronic component 21 mounted on the electronic device 100 include an optical semiconductor element such as a laser diode (LD) and a photodiode (PD), a semiconductor element including a semiconductor integrated circuit element, a piezoelectric element such as a crystal resonator and a surface acoustic wave element, a pressure sensor element, a capacitative element, and a resistor.

The electronic component 21 may be installed on the wiring board 16 by fixing with a brazing material or a conductive bonding material made of a conductive resin or the like. For example, if the electronic component 21 is mounted on the wiring board 16 after the wiring board 16 is mounted on the submount 17, a brazing material of a gold-tin (Au—Sn) alloy or a gold-germanium (Au—Ge) alloy may be used as the bonding material for fixing the wiring board 16. For fixing the electronic component 21, a brazing material of a tin-silver (Sn—Ag) alloy or a tin-silver-copper (Sn—Ag—Cu) alloy having a melting point lower than that of the brazing material of the gold-tin alloy or the gold-germanium alloy, or an adhesive made of resin such as Ag epoxy resin that is curable at a temperature lower than the melting point may be used as the bonding material.

The wiring board 16 may be mounted on the submount 17 after the electronic component 21 is mounted on the wiring board 16. In this case, on the contrary to the above-mentioned case, the bonding material used for mounting the wiring board 16 on the submount 17 may have a lower melting point. In both of the cases, paste of the bonding material may be printed on the wiring board 16 by a well-known screen printing method, a bonding material layer may be formed by photolithography, and a preform of a low-melting point brazing material as the bonding material may be placed.

The lid provided on the first face 11a of the base body 11 as necessary in the electronic device 100 has an outer shape along an outer peripheral region of the base body 11. The lid has a shape having a space so as to cover the electronic component 21, the wiring board 16, the submount 17, the first portions 12a of the signal terminals 12, and the dielectric substrate 13 on the first face 11a of the base body 11. When the electronic component 21 is an optical semiconductor element such as a laser diode (LD) and a photodiode (PD), a window member that allows light to pass therethrough may be provided at a portion of the lid facing the electronic component 21, or instead of the window member, an optical fiber and an optical isolator for preventing return light may be bonded together and provided at the portion.

The lid is made of metal such as a Fe—Ni—Co alloy, a Fe—Ni alloy, and a Fe—Mn alloy. A well-known metal processing method such as pressing and punching is performed on a plate material of such metal to manufacture the lid. The lid preferably has almost the same thermal expansion coefficient as that of a material for the base body 11, and the same material as that for the base body 11 is used for the lid. When the lid has a window member, a glass window member having a flat plate shape or a lens shape is bonded to a hole formed in the portion facing the electronic component 21 with a low-melting glass or the like.

The lid is bonded to the base body 11 by welding such as seam welding and YAG laser welding or by brazing with a bonding material such as a Au—Sn brazing material.

The present invention is not limited to the above-described embodiments, and various modifications may be made to the embodiments without departing from the scope of the present invention.

For example, the above-described embodiments are described with an example of the electronic component mounting package 1 including the circular base body 11 as illustrated in FIG. 1, but a box-shaped electronic component mounting package may be used.

As long as the dielectric substrate 13 has a width larger than a width of the first portion 12a, the shape of the dielectric substrate 13 is not limited to a rectangular shape and its shape may be true circular, elliptic, or polygonal.

REFERENCE SIGNS LIST

1 Electronic component mounting package
11 Base body
11a First face
11b Through hole
11c Insulating material
11d Fourth face
12 Signal terminal
12a First portion of signal terminal
13 Dielectric substrate
13a Second face
13b Third face
14 Bonding material
15 Ground terminal
16 Wiring board
16a Signal line conductor
16b Signal line conductor
17 Submount
18 Bonding wire 21 Electronic component
100 Electronic device

The invention claimed is:

1. An electronic component mounting package, comprising:
   a plate shape base body formed from a first metal, the plate shape base body having a top face, a bottom face that is separated from the top face by a thickness along a first axis, and a through hole penetrating the top face and the bottom face along the first axis;
   a first signal terminal and a second signal terminal that form a pair of signal terminals that transmit a signal, wherein the first signal terminal and the second signal terminal are secured in the through hole of plate shape base body by an insulating material such a gap is formed between the first signal terminal and the second signal terminal along a second axis that is orthogonal to the first axis, and first portions of the first terminal and the second terminal protrude through the top face; and
   a plate shape dielectric substrate that includes a side face, a second face and a third face, that is provided above the through hole of plate shape base body between the first portions, wherein:
      the side face of the plate shape dielectric substrate is parallel to the top face and abuts the insulating material in the through hole,
      the second face of the plate shape dielectric substrate is perpendicular to the top face of the base body and faces the first signal terminal,
      the third face of the plate shape dielectric substrate is perpendicular to the top face of the base body and faces the second signal terminal, and
      the plate shape dielectric substrate has a height that is less than a height of the first portions along the first axis,
      a bonding material that bonds the second face to the first signal terminal and bonds the third face to the second signal terminal, and
      the second face of the plate shape dielectric substrate is opposite to the third face of the plate shape dielectric substrate.

2. The electronic component mounting package according to claim 1, wherein the pair of signal terminals transmit a differential signal.

3. An electronic device, comprising:
   the electronic component mounting package according to claim 1; and
   an electronic component mounted on the top face of the base body.

4. The electronic device according to claim 3, further comprising a wire member that electrically connects the electronic component and each of the first portions of the pair of signal terminals.

5. The electronic component mounting package according to claim 1, wherein the pair of signal terminals transmit a differential signal.

6. The electronic component mounting package according to claim 1, wherein the first metal is an iron-based alloy.

7. The electronic component mounting package according to claim 1, wherein the first metal is a Fe—Ni—Co alloy.

8. The electronic component mounting package according to claim 1, wherein the first metal is a Fe—Mn alloy.

9. The electronic component mounting package according to claim 8, wherein the Fe—Mn alloy contains 99.6% Fe by mass and 0.4% Mn by mass.

10. The electronic component mounting package according to claim 1, wherein the top face includes one or more layers of Ni and one or more layers of Au that are successively plated.

11. The electronic component mounting package according to claim 10, wherein a thickness of the one or more layers of Ni are 0.5 to 9 μm along the first axis.

12. The electronic component mounting package according to claim 10, wherein a thickness of the one or more layers of Au are 0.5 to 5 μm along the first axis.

13. The electronic component mounting package according to claim 1, wherein the insulating material includes lithium oxide.

* * * * *